(12) United States Patent
Soberanes et al.

(10) Patent No.: US 12,147,702 B2
(45) Date of Patent: Nov. 19, 2024

(54) HOST TRAINING INDICATION FOR MEMORY ARTIFICIAL INTELLIGENCE

(71) Applicant: Micron Technology, Inc., Boise, ID (US)

(72) Inventors: Nicolas Soberanes, Boise, ID (US);
Ezra E. Hartz, Boise, ID (US);
Jonathan S. Parry, Boise, ID (US);
Bruce J. Ford, Meridian, ID (US);
Joseph A. De La Cerda, Boise, ID (US); Benjamin Rivera, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 17/579,995

(22) Filed: Jan. 20, 2022

(65) Prior Publication Data

US 2023/0229352 A1     Jul. 20, 2023

(51) Int. Cl.
*G06F 3/06* (2006.01)
*G06F 12/0811* (2016.01)
*G06F 18/214* (2023.01)

(52) U.S. Cl.
CPC .......... *G06F 3/0659* (2013.01); *G06F 3/0604* (2013.01); *G06F 3/0625* (2013.01); *G06F 3/0679* (2013.01); *G06F 12/0811* (2013.01); *G06F 18/214* (2023.01)

(58) Field of Classification Search
CPC .... G06F 3/0659; G06F 18/214; G06F 3/0604; G06F 3/0625; G06F 3/0679; G06F 12/0811
USPC ........................................................ 711/154
See application file for complete search history.

(56) References Cited

U.S. PATENT DOCUMENTS

| | | | |
|---|---|---|---|
| 10,649,988 B1 | 5/2020 | Gold et al. | |
| 2008/0082496 A1* | 4/2008 | Kalos | G06F 3/0683 |
| 2019/0220703 A1 | 7/2019 | Prakash | |
| 2019/0243570 A1* | 8/2019 | Mittal | G06F 3/0649 |
| 2019/0303759 A1 | 10/2019 | Farabet | |
| 2019/0347039 A1* | 11/2019 | Velusamy | G06F 9/4881 |
| 2020/0019506 A1* | 1/2020 | Ray | G06F 12/0871 |
| 2021/0089225 A1* | 3/2021 | Boyd | G06F 3/0679 |
| 2023/0147294 A1* | 5/2023 | Sreedhar | G06N 3/0495 |
| | | | 711/103 |

* cited by examiner

*Primary Examiner* — Gautam Sain
(74) *Attorney, Agent, or Firm* — Brooks, Cameron & Huebsch, PLLC (57) ABSTRACT

A host can determine whether to train an AI accelerator of a memory sub-system. Responsive to determining to train the AI accelerator, the host can determine a training category corresponding to a memory access request. The host can also provide an indication to the memory sub-system that causes training of the AI accelerator to be performed based on the training category.

22 Claims, 5 Drawing Sheets

HOST TRAINING INDICATION FOR MEMORY ARTIFICIAL INTELLIGENCE

TECHNICAL FIELD

Embodiments of the disclosure relate generally to memory sub-systems, and more specifically, relate to providing a training indication from a host to memory artificial intelligence.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to providing a training indication from a host to a memory artificial intelligence, in particular to memory sub-systems that include artificial intelligence can receive the indication from a host identifying training examples. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

Memory sub-system can utilize cache for receiving data and/or providing data. The cache can be implemented as single-level cell (SLC) cache. As used herein, SLC cache is a type of memory that stores one bit of data per cell. In various examples, the SLC cache can comprise a first portion of a memory sub-system. For example, the SLC cache can comprise a first portion of a memory device of a memory sub-system. The SLC cache can be dynamic or static. A static SLC cache can indicate that the capacity of the first portion does not change. A dynamic SLC cache can indicate that the capacity of the first portion of the memory sub-system changes based on a quantity of data that is stored in the first portion and/or based on a quantity of data that is to be stored in the first portion. Changing the capacity of the first portion can include changing a capacity of a second portion of the memory sub-system and/or memory device of the memory sub-system. For example, a capacity of the first portion of the memory sub-system can be increased at the expense of the second portion of the memory sub-system if dynamic SLC cache is utilized.

In various instances, the memory sub-system can function if a plurality of modes. For example, the memory sub-system can function if a first mode or a second mode. The first mode can be an SLC mode while the second mode is a multi-level cell (MLC) mode. Operating the memory sub-system in a first mode can indicate that data is saved to the SLC cache before being committed to a second portion of the memory sub-system. Operating the memory sub-system in a second mode can indicate that the data is saved to the second portion of the memory sub-system without storing the data in the first portion of the memory sub-system (e.g., SLC cache). Operating the memory sub-system in MLC mode can indicate that the second portion of the memory sub-system is configured to store multiple bits of data per cell. For example, the second portion of the memory sub-system can be configured to store three or more bits of data per cell.

A memory sub-system can utilize SLC cache if there is space in the SLC cache to provide a best performance possible. SLC cache can have performance advantages to different portions of the memory sub-system. Data can be stored to and/or retrieved faster from SLC cache as compared to portions of the memory sub-system that are in a MLC mode (e.g., a second portion of the memory sub-system). Utilizing SLC cache allows for high performance but has some disadvantages. Data saved to SLC cache is moved from SLC to different portions of the memory sub-system for permanent storage and to free up space in the SLC cache for further array operations. Moving data from the SLC cache to the different portions of the memory sub-system can decrease the life of the SLC cache by increasing the program/erase cycles and increasing write amplification given that data is stored in the SLC cache before being stored in different portions of the memory sub-system if there is space in the SLC cache.

In various instances, the use of the memory sub-system in a SLC mode or an MLC mode does not have a noticeable impact on user experience. The memory sub-system can be utilized in an SLC mode or an MLC mode if there is not a noticeable impact on user experience. In various examples, the memory sub-system can be utilized in an SLC mode if there would be a noticeable impact on user experience if the memory sub-system it utilized in an MLC mode. The memory sub-system can be utilized in an SLC mode to provide high performance in processing commands. The commands can include memory commands including memory access requests, for example. To determine whether to utilize the memory sub-system in an SLC mode or an MLC mode, a memory sub-system can implement artificial intelligence (AI).

AI can be used to recognize usage patterns that do not benefit from processing access commands utilizing an SLC mode of the memory sub-system. An MLC mode can be utilized for usage patterns that do not benefit from the use of SLC cache in processing access requests. SLC cache can be utilized for usage patterns that do benefit from high performance in processing access requests. As used herein, an SLC mode or an MLC mode can be utilized to process command by storing data retrieved from memory and associated with the command in the SLC cache and/or different portion of the memory sub-system or storing data in the SLC cache and/or the different portions of the memory sub-system prior to storing the data in the memory where the data corresponds to a command.

A life expectancy of SLC cache can be improved by performing array operations directly into the different portions of the memory sub-system utilizing the MLC mode. Performing array operations using the MLC mode can improve the life expectancy of SLC cache by saving program/erase cycles from the SLC cache and by keeping write amplification low without impact to the end user experience. However, the memory sub-system may be inefficient in training the AI to determine whether to utilize a memory sub-system in an SLC mode or an MLC mode.

Aspects of the present disclosure address the above and other deficiencies by providing signal from a host to the memory sub-system identifying training examples for the training of the AI. A host can be in a better position than a memory sub-system to identify training examples. The host can access data regarding a state of a computing device that can be used to identify training examples. The host also has knowledge of the types of processes that are providing commands to the memory. The host can utilize the knowledge of the processes to identify training examples. The host can identify training examples more efficiently and accurately than the memory sub-system.

As used herein, AI refers to the ability to improve a machine through "learning" such as by storing patterns and/or examples which can be utilized to take actions at a later time. The patterns and/or examples stored and utilized can include patterns that are used to determine whether to use an SLC mode or an MLC mode. Machine learning refers to a device's ability to learn from data provided as examples. Machine learning can be a subset of AI. AI can be implemented as an artificial neural network (ANN). As used herein, an ANN can provide learning by forming probability weight associations between an input and an output. The probability weight associations can be provided by a plurality of nodes that comprise the ANN. The nodes together with weights, biases, and activation functions can be used to generate an output of the ANN based on the input to the ANN. An ANN can utilize a number of inputs to generate an identifier of blocks and/or word lines that are forecasted to fail.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Figure 1:
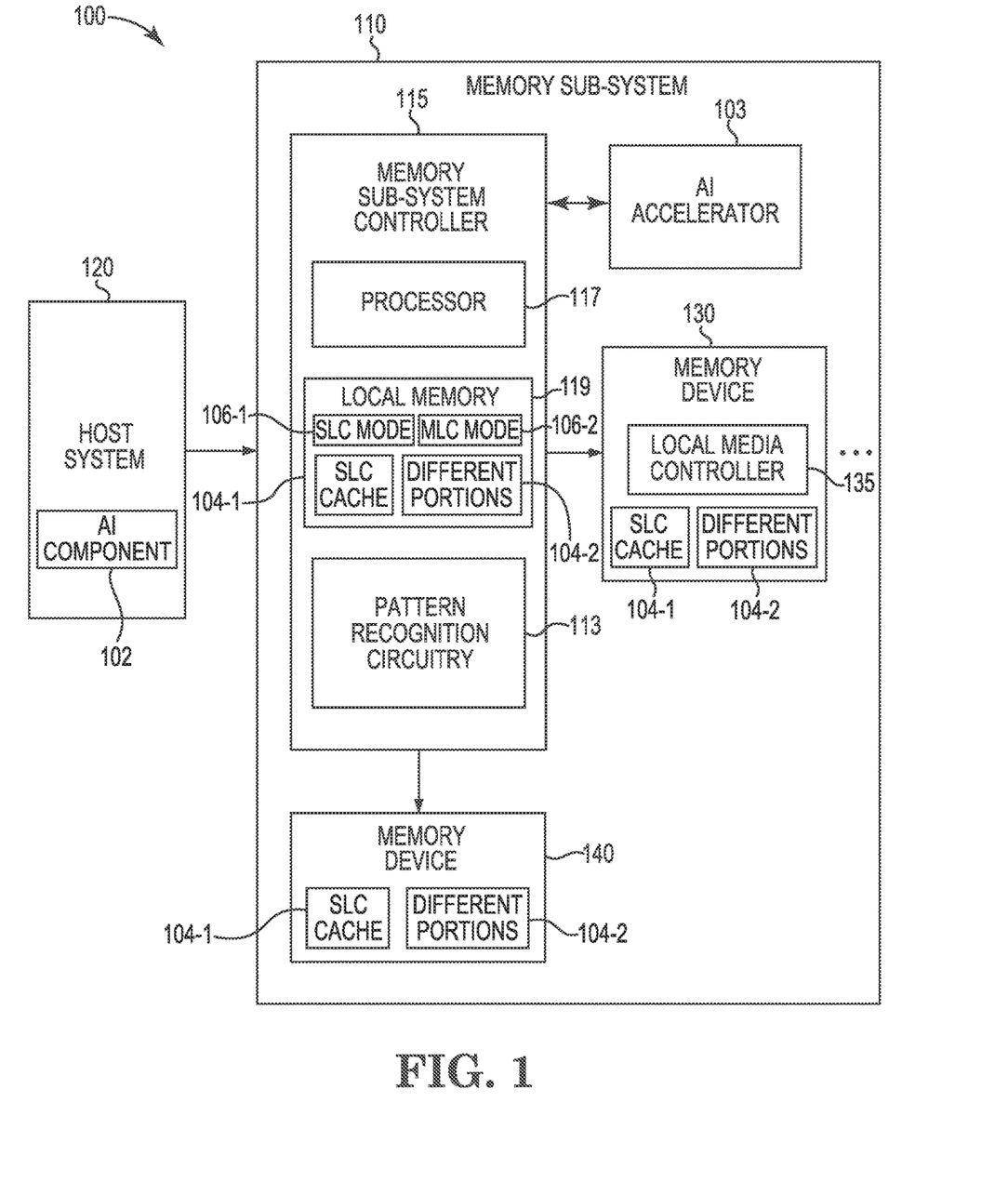
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single-level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system). In various examples, the local memory 119 can include registers 106-1 and 106-2 configured to store a mode in which the memory sub-system 110 operates. For example, the registers 106-1 can be configured to store data that can be used to configure the memory sub-system to function in a first mode while the register 106-2 can be configured to store data that can be used to configure the memory sub-system to function in a second mode. Although two registers 106-1 an 106-2 are shown, the local memory 119 can comprise more or less than the two registers shown to store whether the memory sub-system is configured to function in a first mode or a second mode.

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include pattern recognition circuitry 113. Although not shown in FIG. 1 so as to not obfuscate the drawings, the pattern recognition circuitry 113 can include various circuitry to facilitate recognizing patterns to select an SLC mode or an MLC mode for the memory sub-system 110. The SLC mode can be selected to utilize SLC cache 104-1 while the MLC mode can be selected to utilize different portions 104-2 of the memory sub-system for processing commands received by the memory sub-system 110. In some embodiments, the pattern recognition circuitry 113 can include special purpose circuitry in the form of an ASIC, FPGA, state machine, and/or other logic circuitry that can allow the pattern recognition circuitry 113 to orchestrate and/or perform operations as described herein.

In some embodiments, the memory sub-system controller 115 includes at least a portion of the pattern recognition circuitry 113. The memory sub-system controller 115 can include a processor 117 (processing device) configured to execute instructions stored in local memory 119 for performing the operations described herein. In some embodiments, the pattern recognition circuitry 113 can be part of the host system 110, an application, or an operating system.

In a non-limiting example, an apparatus (e.g., the computing system 100) can include the pattern recognition circuitry 113. The pattern recognition circuitry 113 can be resident on the memory sub-system 110. As used herein, the term "resident on" refers to something that is physically located on a particular component. For example, the pattern recognition circuitry 113 being "resident on" the memory sub-system 110 refers to a condition in which the hardware circuitry that comprises the pattern recognition circuitry 113 is physically located on the memory sub-system 110. The term "resident on" can be used interchangeably with other terms such as "deployed on" or "located on," herein.

The pattern recognition circuitry 113 can be configured to determine whether to utilize an SLC mode or an MLC mode to process commands received by the memory sub-system 110. The pattern recognition circuitry 113 can utilize an AI accelerator 103 to determine whether to utilize the SLC mode or the MLC mode. The pattern recognition circuitry 113 can provide metadata of the command received by the memory sub-system to the AI accelerator 103. The AI accelerator 103 can return an identification (ID) of the SLC mode or the MLC mode to the pattern recognition circuitry 113. The pattern recognition circuitry 113 can utilize the SLC mode or the MLC mode based on receipt of the ID of the SLC mode or the MLC mode from the AI accelerator 103.

As used herein the AI accelerator 103 can include hardware and/or firmware configured to implement AI. The AI accelerator 103 can comprise various circuitry (e.g., hardware) such as one or more processing devices (e.g., microprocessors) such as a graphic processing unit (GPU), an application specific integrated circuit (ASIC), or a field-programmable gate array (FPGA), for example. The processors of the AI accelerator 103 can perform low-precision arithmetic operations. The AI accelerator 103 can be implemented using phase-change memory, for example. The processors of the AI accelerator 103 can be memory cells of a memory array. The memory cells can be used to perform matrix multiplication, for example. The memory cells can be configured to perform operations by controlling the resistance of the memory cells. The memory cells can be used to perform operations in parallel. In various examples, the AI accelerator 103 can implement processors that are separate from the memory cells of a memory array.

The AI accelerator 103 can be a deep learning accelerator (DLA), for example. The AI accelerator can be implemented on an edge of the memory sub-system 110. For example, the AI accelerator 103 can be implemented external to the memory devices 130, 140. The AI accelerator 103 can be coupled to an output path that couples the memory devices 130,140 to the I/O circuitry of the memory sub-system 110. The AI accelerator 103 can comprise feedback circuitry, for example.

The AI accelerator 103 can also be coupled to the memory sub-system controller 115. The memory sub-system controller 115 can control the AI accelerator 103. The memory sub-system controller 115 can provide data to the AI accelerator 103 and can receive outputs from the AI accelerator 103. The input to the AI accelerator 103 can be provided as input to an ANN which is hosted by the AI accelerator 103. The memory sub-system controller 116 can also cause the output of the AI accelerator 103 and/or the ANN to be provided to the memory devices 103 and/or the host system 120.

In various instances, the pattern recognition circuitry 113 can train the AI accelerator 103. The pattern recognition circuitry 113 can train the AI accelerator 103 by generating weights, biases, and/or activation functions and configuring the AI accelerator 103 using the weights, biases, and/or activation functions.

The pattern recognition circuitry 113 can generate the weights, biases, and/or activation functions using AI. For instance, the pattern recognition circuitry 113 can generate the weights, biases, and/or activation functions using a different ANN than the ANN implemented by the AI accelerator 103. The pattern recognition circuitry 113 can utilize examples to train the AI accelerator 103 by inputting the examples to the different ANN and receiving the weights, biases, and/or activation functions as an output from the different ANN. The pattern recognition circuitry 113 can configure an ANN of the AI accelerator 103 using the weights, biases, and/or activation functions, for example. In various instances, the different ANN can be implemented using the AI accelerator 103 or can be implemented using different hardware/firmware. For example, the different ANN can be implemented by the processor 117 and/or the pattern recognition circuitry 113.

Although the AI accelerator 103 is shown as being external to the memory sub-system controller 115, the AI accelerator 103 can be implemented internal to the memory sub-system controller 115. For example, the AI accelerator 103 can be implemented internal to the pattern recognition circuitry 113.

The training examples used by the pattern recognition circuitry 113 can be provided and/or identified by the AI component 102. The AI component 102 can be implemented in the host system 120. The AI component 102 can identify examples that are to be used by the pattern recognition circuitry 113 to train the AI accelerator 103.

The AI component 102 may have access to more data than the pattern recognition circuitry 113 has access to which allows the AI component 102 to identify examples that can be used for training with more accuracy than the pattern recognition circuitry 113 can identify. For instance, the AI component 102 can determine whether the computing system 100 is in a state that is conductive for training. The AI component 102 can also determine a category (e.g., training category) of examples of access commands. A training category can include a first category (e.g., high performance event) or a second category (e.g., low performance event) of access commands (e.g., memory access commands). Determining a category (e.g., training category) can include determining whether commands (e.g., access commands) provided by the host system 120 to the memory sub-system 110 may be classified as a high performance events or low performance events. As used herein, a high performance event and a low performance event can describe the resources utilized to process corresponding commands. For instance, processing an access command having a first category (e.g., high performance events) can utilize more resources of the memory sub-system 110 than processing a different access command having a second (e.g., low performance events). Executing access commands in an SLC mode can provide higher performance as compared to executing access commands in an MLC mode which can be described as providing lower performance. High performance events are commands that, when processed, may benefit from the utilization of SLC cache 104-1. Low performance events are commands that, when processed, may not benefit from the utilization of SLC cache 104-1 but instead may utilize different portions 104-2 of the memory sub-system 110 without degrading a user experience. The different portions 104-2 can be utilized without degrading user experience if there would be no noticeable difference between the use of the different portions 104-2 and the SLC cache 104-1 in processing commands. In various instances, the SLC cache 104-1 and the different portions 104-2 can be implemented in the memory devices 130, 140 and/or the local memory 119.

Figure 2:
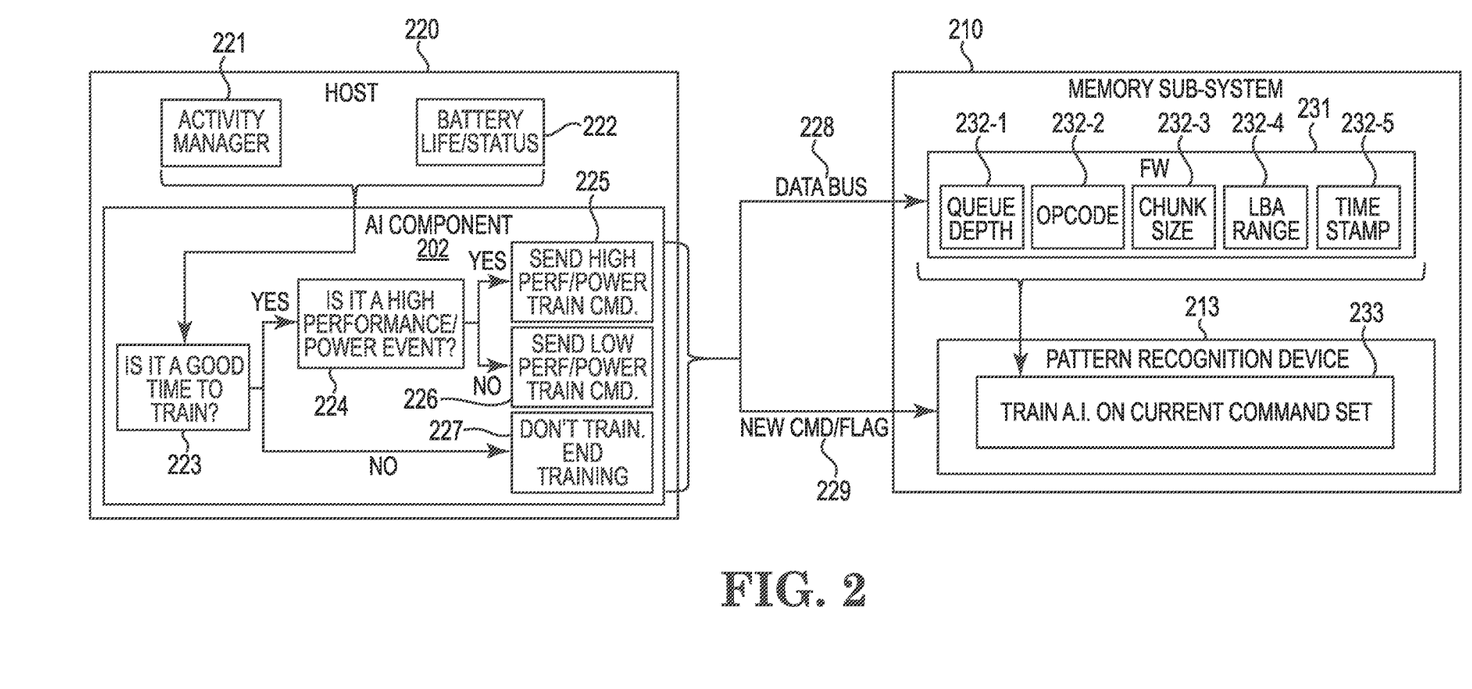
FIG. 2 illustrates a block diagram of an example AI component in accordance with some embodiments of the present disclosure.

FIG. 2 illustrates a block diagram of an example AI component 202 in accordance with some embodiments of the present disclosure. The block diagram includes a host 220 and the memory sub-system 210. The host 220 includes an activity manager 221 and battery life/status circuitry 222. The host 220 also includes the AI component 202. The memory sub-system 210 includes firmware 231 and pattern recognition circuitry 213.

The activity manager 221 and/or the battery life/status circuitry 222 can be coupled to the AI component 202. The activity manager 221 and/or the battery life/status circuitry 222 can provide data to the AI component 202. The AI component 202 can utilize the data received from the activity manager 221 and the battery life/status circuitry 222 to provide signals to the memory sub-system 210.

The battery life/status circuitry 222 can provide a status of a computing system comprising the host 220 and/or the memory sub-system 210. The status of the computing system can describe a power status of the computing system. The status of the computing system can include a charging status, a sleep status, or an active status, among other possible status of the computing system that describe a power status of the computing system.

The power status of the computing system can be utilized by the AI component 202 to determine whether it is a good time to train the AI accelerator at operation 223. "A good time to train" can include a time at which the training the AI accelerator would not have a negative effect on the battery life of the computing system. For instance, if the computing system is charging (e.g., charging status), then the computing system can absorb the power cost of training the AI accelerator. The AI accelerator may not be charged if the computing system is in a sleep state (e.g., sleep status) and/or an active state (e.g., active status).

The AI component 202 may determine whether it is a good time to train the AI accelerator based on a battery charge (e.g., battery life) provided by the battery life/status 222. For example, the AI component 202 can determine that it is not a good time to train if the battery charge is less than a threshold. The AI component 202 can determine that it is a good time to train the AI accelerator if the batter charge is greater than the threshold. The battery charge can be provided, for example, as a percentage, among other scales used to measure the battery charge.

The AI component 202 can determine whether it is a good time to train the AI accelerator based on a power status of the computing system and a battery charge of the computing system. For example, the AI component 202 can determine that it is a good time to train if the computing system is in a charge state or the batter charge is greater than a threshold. The AI component 202 can determine it is not a good time to train if the charge state is an active state or a sleep state and the batter charge is not greater than the threshold.

Responsive to determining that it is not a good time to train, the AI component 202 can provide a signal to the memory sub-system 210 indicating that it is not a good time to train. The AI component 202 can also refrain from providing a signal (e.g., indicating that it is a good time to train or indicating that is it not a good time to train) to the memory sub-system 210 which can be construed by the memory sub-system 210 as an indication that it is not a good time to trail.

Responsive to determining that it is a good time to train, the AI component 202 can determine, at operation 224, whether a corresponding command has a first category indicating a high performance event. An event can be determined as having a first category based on the resources utilized or the power utilized in executing a corresponding command. The AI component 202 can determine whether a command has a first category based on the data provided by the activity manager 221.

The activity manager 221 can comprise hardware and/or firmware. The activity manager 221 can provide data describing a specific activity that is triggering the command. For instance, the activity manager 221 can identify an application type that triggered the command to the ai component 202. The application type can be identified utilizing a process ID of the process that triggered the command, for example. The application type can be a video type, an audio type, an image type, among other types of applications. The AI component 202 can determine whether the process ID is a predetermined process ID that identified the process as a process that triggers commands that are a first category or a second category. For example, the activity manager 221 can provide a process ID corresponding to a virtual realty game or an application recording video (e.g., 4 k video at 60 fps). The AI component 202 can determine that the process ID corresponds to a process that triggers access commands having a first category or a second category (e.g., training category). The AI component 202 can compare the process ID with a plurality of process IDs that are known to trigger a first category or a second category. The AI component 202, responsive to identifying a match, can identify a corresponding command as a first category or a second category at operation 224.

Responsive to identifying the command as a first category or a second category, the AI component 202 can, at operation 225, provide an indication (e.g., a signal) to the memory sub-system 210 that is interpreted as a request to train the AI accelerator using the corresponding command as an example of a first category or a second category. Responsive to identifying the command as a second category (e.g., low performance event), the AI component 202 can, at operation 226, provide an indication to the memory sub-system 210 that is interpreted as a request to train the AI accelerator using the corresponding command as a second category (e.g., second category indicating a low performance event). Commands that are not identified, at operation 224, as having a first category can be identified as having a second category.

The indications provided from the AI component 202 to the memory sub-system 210 can be provided as a flag or a command 229 to the pattern recognition circuitry 213. In various examples, the indications provided from the AI component 202 can be provided via the data bus 228. For example, the data corresponding to a command provided to the memory sub-system 210 can be modified to include the indication provided by the AI component 202. In various instances, the AI component 202 can modify the data to include the indication. The flags and/or commands 229 can also be provided via a command bus, for example.

The pattern recognition circuitry 213 can receive the data provided by the AI component 202. The pattern recognition circuitry 213 can retrieve a flag from the data. The flag can identify the command as a first category (e.g., high performance event), a second category (e.g., low performance event), or can instruct the pattern recognition circuitry 213 not to train using the command. A flag identifying the command as a first category or a second category can include an instruction to train using the corresponding command. At operation 233, the pattern recognition circuitry 213 can train the AI accelerator using the corresponding command (e.g., current command set).

In various examples, the memory sub-system 231 can utilize metadata corresponding to a command to train the AI accelerator. For example, the firmware 231 can collect the metadata and provide the metadata to the pattern recognition circuitry 213. The firmware 213 can provide a queue depth 231-1, an opcode 232-2, a chunk size 232-3, a logical block address (LBA) range 232-4, and/or a time stamp 232-5 corresponding to a command to the pattern recognition circuitry 213 for training.

In various instances, the firmware 231 can provide the metadata for each command to the pattern recognition circuitry 213 or can provide the metadata for each command when the pattern recognition circuitry 213 requests the metadata. The pattern recognition circuitry 213 can request the data when the AI component 202 identifies a training example as a first category or a second category, for example.

The queue depth 231-1 is an outstanding number of commends received by the memory sub-system 210. For example, the queue depth 231-1 can be a number of outstanding commands received prior to receipt of a command which is being used to train. The opcode 232-2 can describe an operation to be performed. The opcode 232-2 corresponding to the command used for training can describe a particular operation that is performed responsive to receipt of the command. The opcode 232-2 can include read operations, write operations, and/or logical operations, for example. Logical operations can include AND operations, OR operations, XOR operations, NOR operations, and/or NOT operations, among other types of logical operations that can be performed by the memory sub-system 210 responsive to receipt of a command. The opcode 232-2 can also include addition operations, subtraction operations, multiplication operation and/or division operations, among other types of operations.

The chunk size 232-3 can describe a chunk size of the data corresponding to the command used for training. The LBA range 232-4 can describe addresses corresponding to the command. For instance, the LBA range 232-4 can describe addresses to which data corresponding to the command is stored. The LBA range 232-4 can also describe addresses from which data, requested by the command, is read. The time stamp 232-5 can describe a time corresponding to the command used for training. For instance, the time stamp 232-5 can describe a time at which the command was received by the memory sub-system 210.

Figure 3:
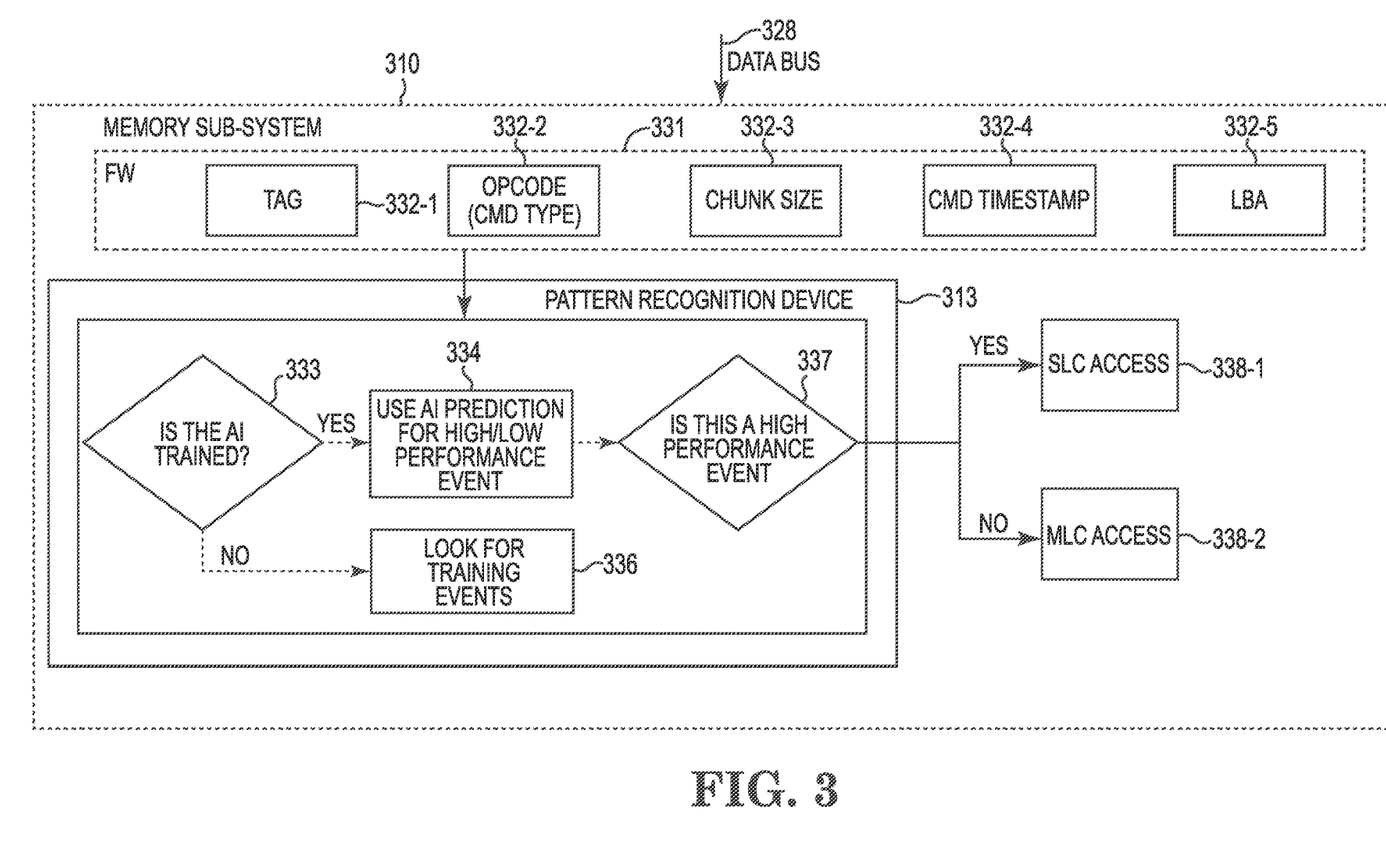
FIG. 3 illustrates a block diagram of an example pattern recognition circuitry in accordance with some embodiments of the present disclosure.

FIG. 3 illustrates a block diagram of an example pattern recognition circuitry 313 in accordance with some embodiments of the present disclosure. The memory sub-system 310 includes the firmware 331 and the pattern recognition circuitry 313.

The firmware 331 can provide a tag 332-1, an opcode 332-2, a chunk size 332-3, a time stamp 332-4, and/or an LBA 332-5 to the pattern recognition circuitry 313. The firmware 331 can receive the tag 332-1, the opcode 332-2, the chunk size 332-3, the time stamp 332-4, and/or the LBA 332-5 via the data bus 328. The tag 332-1 can represent a tag provided by the AI component 202 that can be used by the pattern recognition circuitry 213, of FIG. 2, to determine whether to train the AI accelerator and/or that can be used to identify a training example as a first category (e.g., a high performance event) or a second category (e.g., a low performance event).

The pattern recognition circuitry 313 can, at operation 333, determine whether the AI accelerator is trained. If the AI accelerator is trained, the pattern recognition circuitry 313 can provide the metadata corresponding to a command to the AI accelerator. The pattern recognition circuitry 313 can provide the opcode 332-2, the chunk size 332-3, the timestamp 332-4, and/or the LBA 332-5 to the AI accelerator. The AI accelerator can return an indication of whether to process the command in a SLC mode or an MLC mode. The AI accelerator can provide an indication that the command is an example of a first category or a second category. The pattern recognition circuitry 313 can determine whether the output of the AI accelerator indicates that the command is an example of a first category or a second category at operation 337.

The pattern recognition circuitry 313 can output the determination of whether to process the command in an SLC mode or an MLC mode to a memory sub-system controller based on whether the command has a first category or a second category. If the AI accelerator indicates that the command is a first category (e.g., a high performance event), then the pattern recognition circuitry 313 can output an indication that the command is the first category. If the AI accelerator indicates that the command is a second category, then the pattern recognition circuitry 313 can output an indication that the command is a second category (e.g., is not a high performance event).

The memory sub-system controller can coordinate SLC access 338-1 and/or MLC access 338-2 based on the output of the pattern recognition circuitry 313. For example, if the pattern recognition circuitry 313 outputs a signal that indicates that an SLC mode should be utilized, then the memory sub-system controller can provide access to the memory sub-system in an SLC mode given that data stored in the SLC cache will be migrated to a different portion of the memory sub-system once the data is not needed in the SLC cache. If the pattern recognition circuitry 313 outputs a signal that indicates that the MLC mode should be utilized, then the memory sub-system controller can provide access to the different portions of the memory sub-system but not the SLC cache.

At operation 336, the pattern recognition circuitry 313 can look for training examples based on the tag 332-1. For example, the pattern recognition circuitry 313 can train the AI accelerator using command metadata as a first category or a second category.

At operation 336, the pattern recognition circuitry 313 can indicate to utilize an SLC mode as a default indication if the AI accelerator is unusable given that the AI accelerator is untrained. In various examples, the pattern recognition circuitry 313 can train the AI accelerator without determining if the AI accelerator is trained as is done at operation 333. The pattern recognition circuitry 313 can train the AI accelerator any time the tag 332-1 identifies a training example. The pattern recognition circuitry 313 can train using the tag 332-1 concurrently with the use the AI accelerator to predict a first category or a second category at operation 334.

Figure 4:
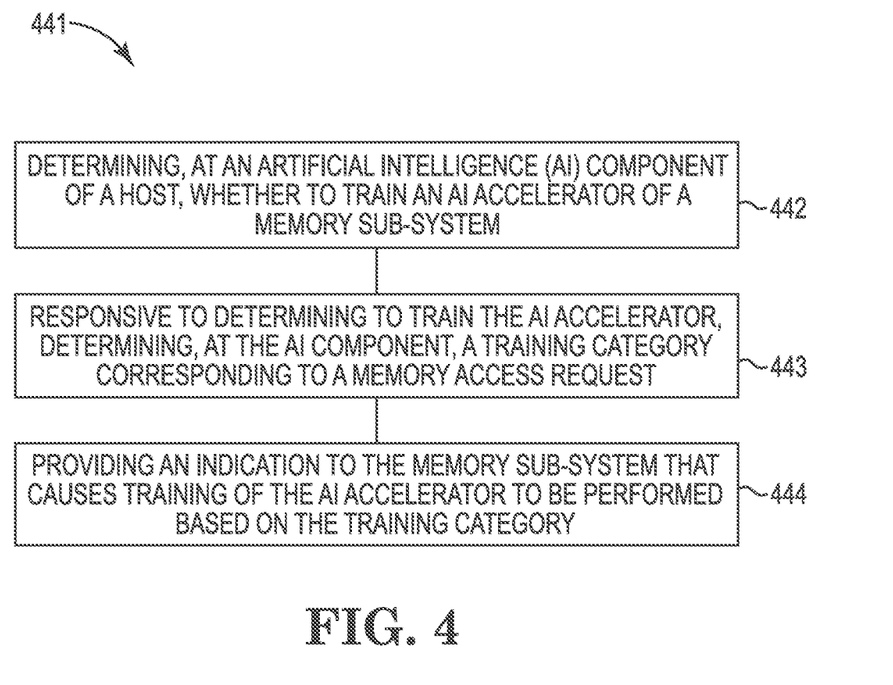
FIG. 4 is a flow diagram corresponding to a method for identifying training examples in accordance with some embodiments of the present disclosure.

FIG. 4 is a flow diagram corresponding to a method 441 for identifying training examples in accordance with some embodiments of the present disclosure. The method 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 441 is performed by the AI component 102 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, a determination can be made as to whether to train an AI accelerator of a memory sub-system. The determination can be made at an artificial intelligence (AI) component of a host. The host can be coupled to the memory sub-system. The determination can be made based on a power status of the computing system comprising the host and/or the memory sub-system. The determination can be made based on a battery life of a batter of the computing system. The battery life can be described by a percentage of battery life remaining of a battery of the computing system. A determination can be made to train the AI accelerator if the battery life is greater than a threshold. A determination can be made to refrain from training the AI accelerator if the battery life is less than the threshold. For example, a determination can be made to not train the AI accelerator if the battery life is less than the threshold.

The determination as to whether to train the AI accelerator of the memory sub-system can be based on a charging status of the host. For example, a determination can be made to train the AI accelerator if the battery supplying power to the host is being charged. In various instances, a determination can be made to refrain from training the AI accelerator if the battery supplying power to the host is not being charged.

At operation 443, responsive to determining to train the AI accelerator, a training category corresponding to a memory access request can be determined. The determination can be made at the AI component. The determination can be made based on whether a processing of the memory access request utilizing the SLC mode would have a noticeable difference over the processing of the memory access request utilizing the MLC mode. The determination could also be made based on whether the processing of the memory access requests could benefit from the utilization of the SLC mode as opposed to the MLC mode to process the memory access requests.

At operation 444, an indication can be provided to the memory sub-system that causes training of the AI accelerator to be performed based on the training category. The indication can be provided via a data bus. For example, data corresponding to the memory access requests can be modified to include a flag (e.g., indication). The memory sub-system can determine whether to train the AI accelerator based on the flag.

Responsive to determining the training category corresponding to the memory access request is a first category, the memory access request can be utilized as a first category for training the AI accelerator. The first category can describe that more resources (e.g., resources of the memory sub-system) are utilized to process the memory access request as compared to a different memory access request falling under a second category. Responsive to determining the training category corresponding to the memory access request is a second category, the memory access request can be utilized as a second category for training the AI accelerator.

In various examples, the memory access request can be determined to be a first category based on a process that provided the memory access request. The process can describe an application, for example. The application can be categorized as providing memory access requests that fall under the first category and/or a second category. Memory access requests can be classified under the first category if the processing of the memory access request utilizes more resources of the memory sub-system than a resource threshold, for example. Determining the training category can also include determining whether the memory access requests is to be processed by the memory sub-system in an SLC mode or an MLC mode.

Responsive to determining not to train the AI accelerator of the memory sub-system, the memory access requests can be provided to the memory sub-system without providing the indication. Not providing an indication can be construed as instructions not to train the AI accelerator using the memory access request. The data corresponding to the memory access request may not be modified to include the indication. The indication can be flags inserted in the data. The flags can be inserted in the data by inserting bits in the data. For examples, a number of bits with particular values that can represent a first flag and a number of bits with different values can represent a second flag that are inserted in data transferred to the memory sub-system.

In various instances, pattern recognition circuitry can determine whether to utilize an SLC mode or an MLC mode to process memory access requests. A number of memory access requests can be received from the host. An indication can be received from the host. The indication can be, for example, a signal that indicates whether the memory access requests are to be utilized as examples of a training category for training purposes. For example, the indication can be received from a host. The indication can indicate that AI training is to be performed on the number of memory access requests. The indication provides a training category corresponding to the number of memory access requests. Responsive to receiving the indication, AI training can be performed on the number of memory access requests. The memory sub-system can perform the AI training using the number of memory access requests. For example, a processing device (e.g., memory sub-system controller) of the memory sub-system can process the number of memory access requests using an SLC mode or an MLC mode, of the memory sub-system, based on an output of an AI accelerator of the memory sub-system.

The pattern recognition circuitry can train the AI accelerator utilizing the memory access requests and metadata of the memory access requests. The AI accelerator can be trained utilizing a queue depth, opcode, chunk size, LBA range, time stamp, and/or other metadata (e.g., metadata item) of the memory access request. The queue depth, opcode, chunk size, LBA range, and/or time stamp the memory access request can be metadata of the memory access request.

The pattern recognition circuitry can, responsive to the number of memory access requests being identified as first categories of the training category, utilize a first portion of the memory device and a second portion of the memory device according to the SLC mode to process the number of memory access requests. The first portion of the memory device can be SLC cache in various examples. The pattern recognition circuitry can also, responsive to the number of memory access requests being identified as second categories of the training category, utilize the second portion of the memory device and not a first portion (e.g., SLC cache) of the memory device according to the MLC mode to process the number of memory access requests.

In various examples, an AI component of the host can monitor host activity to determine whether to perform AI training on a group of memory access requests to be sent to a memory sub-system for processing. The host activity monitored by the AI component can comprise an application type being executed by the processing device of the host. The AI component can monitor the application type corresponding to the group of memory access requests. The application type of the group of memory access requests can be utilized to determine whether to perform AI training on the group of memory access request. The host can also monitor a power supply status. For example, the AI component can monitor whether the status of a power supply to determine whether to perform AI training on the group of memory access requests. The power supply status can include, for example, whether the host is utilizing battery power or not.

Responsive to determining to perform AI training on the group of memory access requests, the AI component can determine a training category corresponding to the group of memory access requests. The AI component can provide an indication to the memory sub-system that causes AI training to be performed on the group of memory access requests upon being sent to the memory sub-system.

The indication provided to the memory sub-system can be provided to pattern recognition circuitry of the memory sub-system. The indication can indicate the training category corresponding to the group of memory access requests. The pattern recognition circuitry can train on the group of memory access requests differently depending on the training category corresponding to the group of memory access requests. For example, the pattern recognition circuitry can utilize the group of memory access requests to train as an example of a first category responsive to the indication corresponding to the first category. The pattern recognition circuitry can utilize the group of memory access requests to train as an example of a second category responsive to the indication corresponding to the second category.

The memory sub-system can include an AI accelerator used to determine, based on the AI training performed on the group of memory access requests, whether to process subsequently received memory access requests utilizing an SLC mode or an MLC mode. In various instances, the memory access requests identified as a first category, by the AI accelerator, can be processed by the memory sub-system utilizing the SLC mode while memory access requests identified as a second category can be processed by the memory sub-system utilizing the MLC mode.

Figure 5:
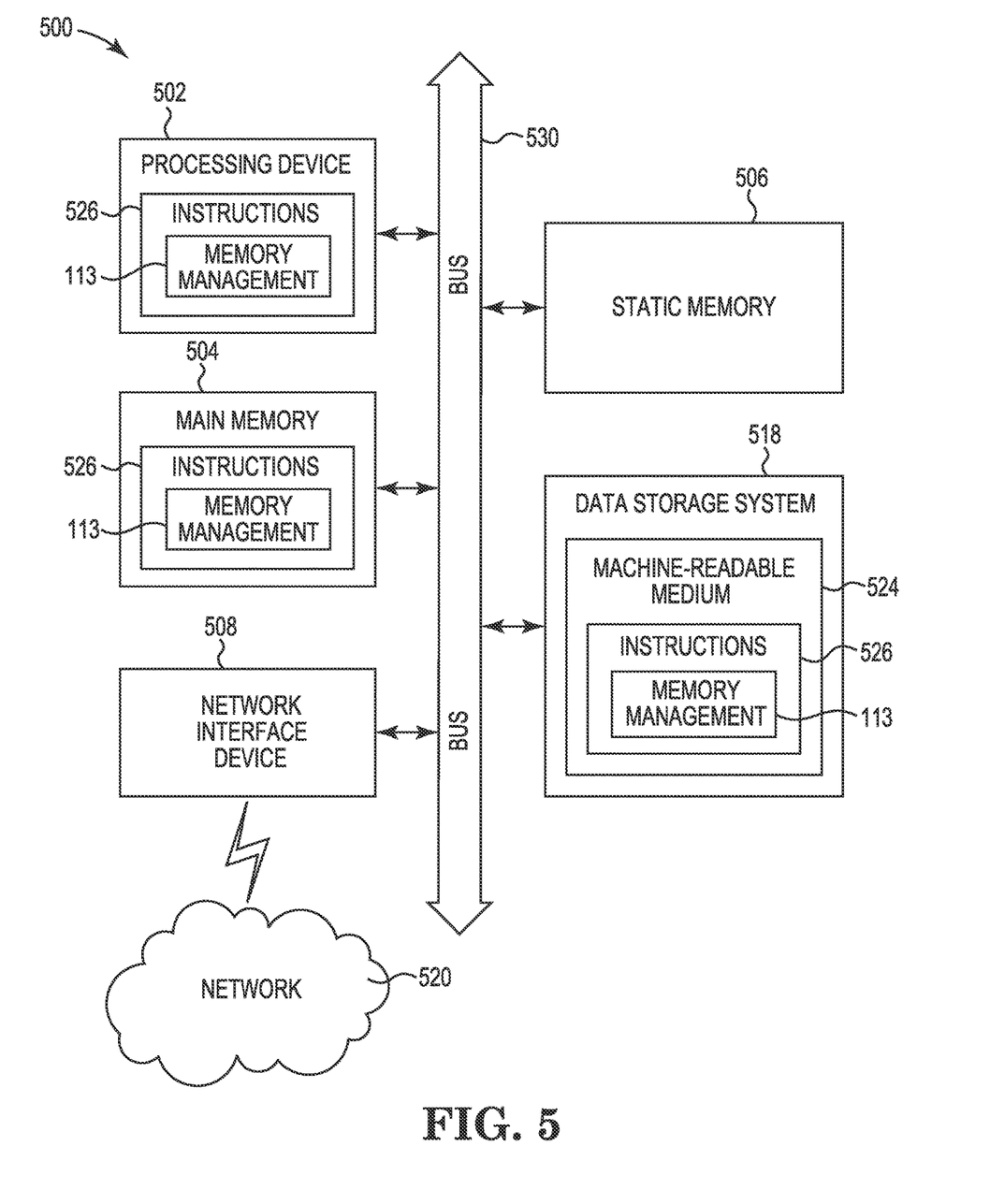
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the pattern recognition circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to providing signal to train an AI accelerator (e.g., AI component 102 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
determining, at an artificial intelligence (AI) component of a host, whether to train an AI accelerator of a memory sub-system;
responsive to determining to train the AI accelerator, determining, at the AI component, a training category corresponding to a memory access request, wherein the training category describes resources of the memory sub-system utilized to process corresponding commands; and
providing an indication to the memory sub-system that causes training of the AI accelerator to be performed based on the training category,
wherein a training is performed using the AI accelerator, utilizing a queue depth, opcode, chunk size logical block address (LBA) range, and time stamp of the memory access request and responsive to providing the indication, and
wherein an output of the AI accelerator is used to process the memory access request in a single-level cell (SLC) mode or a multi-level cell (MLC) mode.

2. The method of claim 1, wherein:
responsive to determining the training category corresponding to the memory access request is a first category, utilizing the memory access request as a first example for training the AI accelerator; and
responsive to determining the training category corresponding to the memory access request is a second category, utilizing the memory access request as a second example for training the AI accelerator.

3. The method of claim 2, further comprising determining that the training category is the first category based on a process that provided the memory access request.

4. The method of claim 3, further comprising determining whether the memory access request was provided by the process identified as utilizing more resources than a threshold quantity of resources.

5. The method of claim 1, wherein determining the training category includes determining whether the memory access request is to be processed by the memory sub-system in the SLC mode or the MLC mode.

6. The method of claim 1, further comprises, responsive to determining not to train the AI accelerator, providing the memory access request to the memory sub-system without providing the indication.

7. The method of claim 1, further comprising determining whether to train the AI accelerator of the memory sub-system based on a battery life of the host.

8. The method of claim 7, further comprising determining to train the AI accelerator if the battery life is greater than a threshold.

9. The method of claim 7, further comprising determining to not train the AI accelerator if the battery life is less than a threshold.

10. The method of claim 1, further comprising determining whether to train the AI accelerator of the memory sub-system based on a charging status of the host.

11. The method of claim 1, further comprising determining to train the AI accelerator if a battery supplying power to the host is charging.

12. An apparatus, comprising:
a memory device;
pattern recognition circuitry coupled to the memory device and configured to:
receive a number of memory access requests;
receive an indication, from a host, that artificial intelligence (AI) training is to be performed on the number of memory access requests, wherein the indication provides a training category corresponding to the number of memory access requests; and
perform AI training, using an AI accelerator, utilizing a queue depth, opcode, chunk size, LBA range, and time stamp of the number of memory access requests responsive to receiving the indication; and
a processing device configured to process the number of memory access requests in a single-level cell (SLC) mode or a multi-level cell (MLC) mode based on an output of the AI accelerator.

13. The apparatus of claim 12, wherein the pattern recognition circuitry is configured to receive the number of memory access requests from the host.

14. The apparatus of claim 12, wherein the pattern recognition circuitry is further configured to train the AI accelerator utilizing the number of memory access requests and metadata of the number of memory access requests.

15. The apparatus of claim 12, wherein the pattern recognition circuitry is further configured to, responsive to the number of memory access requests being identified as first example of the training category, utilize a first portion of the memory device and a second portion of the memory device according to the SLC mode to process the number of memory access requests.

16. The apparatus of claim 12, wherein the pattern recognition circuitry is further configured to, responsive to the number of memory access requests being identified as second examples of the training category, utilize a second portion of the memory device and not a first portion of the memory device according to the MLC mode to process the number of memory access requests.

17. An apparatus, comprising:
a processing device of a host; and
an artificial intelligence (AI) component located on the host and configured to:
monitor host activity to determine whether to perform AI training on a group of memory access requests to be sent to a memory sub-system for processing;
responsive to determining to perform AI training on the group of memory access requests, determine a training category corresponding to the group of memory access requests, wherein the training category describes resources of the memory sub-system utilized to process corresponding commands; and
provide an indication to the memory sub-system that causes AI training to be performed on the group of memory access requests upon being sent to the memory sub-system,
wherein the training is performed using an AI accelerator, utilizing a queue depth, opcode, chunk size logical block address (LBA) range, and time stamp of the group of memory access requests and responsive to providing the indication, and
wherein an output of the AI accelerator is used to process the group of memory access requests in a single-level cell (SLC) mode or a multi-level cell (MLC) mode.

18. The apparatus of claim 17, wherein the indication provided to the memory sub-system is provided to pattern recognition circuitry of the memory sub-system and indicates the training category corresponding to the group of memory access requests such that the pattern recognition circuitry can train on the group of memory access requests differently depending on the training category corresponding to the group of memory access requests.

19. The apparatus of claim 17, wherein the memory sub-system includes an AI accelerator used to determine, based on the AI training performed on the group of memory access requests, whether to process subsequently received memory access requests utilizing the SLC mode or the MLC mode.

20. The apparatus of claim 17, wherein the host activity monitored by the AI component comprises an application type being executed by a processing device of the host.

21. The apparatus of claim 17, wherein the host activity monitored by the AI component comprises a power supply status.

22. The apparatus of claim 17, wherein the host is further configured to add a plurality of bits corresponding to the indication to data corresponding to the group of memory access requests.

* * * * *